United States Patent
Ghosh Dastidar

(10) Patent No.: US 7,266,028 B1
(45) Date of Patent: Sep. 4, 2007

(54) METHOD AND APPARATUS FOR BIT MAPPING MEMORIES IN PROGRAMMABLE LOGIC DEVICE INTEGRATED CIRCUITS DURING AT-SPEED TESTING

(75) Inventor: Jayabrata Ghosh Dastidar, San Jose, CA (US)

(73) Assignee: Altera Corporation, San Jose, CA (US)

( * ) Notice: Subject to any disclaimer, the term of this patent is extended or adjusted under 35 U.S.C. 154(b) by 9 days.

(21) Appl. No.: 11/357,253

(22) Filed: Feb. 16, 2006

(51) Int. Cl.
*G11C 7/00* (2006.01)

(52) U.S. Cl. .................. 365/201; 365/239; 365/230.05

(58) Field of Classification Search ................ 365/201, 365/200, 230.05, 239–240, 230.08
See application file for complete search history.

(56) References Cited

U.S. PATENT DOCUMENTS

| 6,184,707 B1 | 2/2001 | Norman et al. |
| 6,353,552 B2 | 3/2002 | Sample et al. |
| 6,725,442 B1 | 4/2004 | Cote et al. |
| 6,861,870 B1 | 3/2005 | Cheng et al. |
| 6,889,368 B1 * | 5/2005 | Mark et al. ..................... 716/4 |
| 6,950,974 B1 | 9/2005 | Wohl et al. |
| 7,177,221 B1 * | 2/2007 | Chen et al. .............. 365/225.7 |
| 2007/0109017 A1 * | 5/2007 | Liu et al. ...................... 326/41 |
| 2007/0109899 A1 * | 5/2007 | Liu et al. .................... 365/226 |
| 2007/0113106 A1 * | 5/2007 | Liu et al. .................... 713/300 |

\* cited by examiner

*Primary Examiner*—Richard T. Elms
*Assistant Examiner*—Hien Nguyen
(74) *Attorney, Agent, or Firm*—G. Victor Treyz

(57) ABSTRACT

Programmable logic devices may use shadow memory for gathering diagnostic information while testing memory blocks. Memory block testing may be performed at any clock speed allowed during normal operation in a system such as the highest allowed clock speed. Built in self test circuitry and address and data paths are formed by loading configuration data into a programmable logic device. During write operations on a memory block under test, test data words are written into the memory block. A comparator compares data words read from the memory block to expected data words received from the test pattern generator to produce corresponding comparison data words. The comparison data words are written into the shadow memory. The same addresses are applied to the memory block under test and the shadow memory, so the stored comparison data words form a test results bit map indicative of errors in the memory block.

20 Claims, 12 Drawing Sheets

METHOD AND APPARATUS FOR BIT MAPPING MEMORIES IN PROGRAMMABLE LOGIC DEVICE INTEGRATED CIRCUITS DURING AT-SPEED TESTING

BACKGROUND

This invention relates to programmable logic device integrated circuits, and more particularly, to testing programmable logic devices.

Programmable logic devices are a type of integrated circuit that can be programmed by a user to implement a desired custom logic function. In a typical scenario, a logic designer uses computer-aided design (CAD) tools to design a custom logic circuit. These tools help the designer to implement the custom logic circuit using the resources available on a given programmable logic device. When the design process is complete, the CAD tools generate configuration data files. The configuration data is loaded into programmable logic devices to configure them to perform the desired custom logic function.

Programmable logic devices generally contain blocks or regions of random-access memory (RAM). These memory blocks, which are sometimes referred to as embedded array blocks (EABs) are used to handle the storage needs of the circuitry on the device. During normal operation of a programmable logic device, the hardwired and programmable circuitry of the device performs read and write operations on the memory of the blocks. Memory blocks on a programmable logic device typically range in size from a few kilobits to about a megabit or more.

Programmable logic devices are tested during manufacturing. Some programmable logic devices contain redundant circuitry. If testing reveals that a device contains a defect, the device can be repaired by switching the redundant circuitry into use. When testing identifies a defect that cannot be repaired, the device may be discarded. After testing and any necessary repairs have been completed, the device can be programmed for normal operation in a system.

The ability to perform detailed tests on circuitry such as programmable logic device memory block circuitry can be particularly critical during the early phases of product development. These detailed tests can reveal design or process problems. By addressing these problems early during the development of a programmable logic device, the design of the device can be improved to eliminate any process sensitivity or the manufacturing process can be tuned to enhance manufacturing yields.

Conventional memory block testing techniques are generally unable to produce detailed memory block test results. Tests are often performed below normal clock speeds. Tests at normal clocks speeds, which are sometimes referred to as at-speed tests, reveal faults that would otherwise not appear and are therefore critical for thorough testing. Conventional tests are also often unable to produce bit-mapped results. Without bit-mapped data from at-speed memory tests, it can be difficult or impossible to fully eliminate bugs and enhance manufacturing yields.

It would therefore be desirable to be able to produce bit-mapped tests results for at-speed programmable logic device memory tests.

SUMMARY

In accordance with the present invention, programmable logic device integrated circuits are provided that contain memory blocks. To test a given memory block, one or more of the other memory blocks on the programmable logic device are configured to serve as shadow memory.

In a typical test, an address generator generates addresses and a test data pattern generator generates test data words. The test data words are written into the memory block at corresponding addresses. Testing is performed at normal clock speeds, which helps to uncover memory faults that would otherwise not be detected. With one suitable approach, testing is performed at the highest clock speed allowed when operating the memory normally in a system.

Test data that has been written into the memory block is read from the memory block and analyzed using either an on-chip or off-chip analysis process. With one illustrative approach, the programmable logic device being tested is provided with comparator circuitry. The comparator circuitry receives data words read from the memory block and expected data words generated by the test data pattern generator. The comparator circuitry compares each data word read from the memory block to an expected data word and generates a corresponding comparison data word. The comparison data words are stored in the shadow memory. During these operations, the address generator simultaneously applies the same addresses to the memory block and the shadow memory, so the comparison data words written to the shadow memory form a test results bit map indicative of faults in the memory block.

The shadow memory can be implemented using a memory block of the same size as the memory block being tested or using two or more smaller memory blocks. If smaller memory blocks are used for the shadow memory, mapping logic may be used to route the address and data signals to the shadow memory. If desired, OR logic and feedback paths may be provided between the output of the shadow memory and its input. In this configuration, the shadow memory retains a record of past results so that multiple tests can be performed before test results are uploaded to a tester.

Further features of the invention, its nature and various advantages will be more apparent from the accompanying drawings and the following detailed description of the preferred embodiments.

DETAILED DESCRIPTION

The present invention relates to programmable logic devices and programmable logic device memory block testing circuitry. The invention also relates to methods for testing programmable logic device memory block circuits. If desired, the testing circuitry of the present invention may be used in programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic and one or more memory blocks. For clarity, the present invention will generally be described in the context of programmable logic device integrated circuits.

Figure 1:
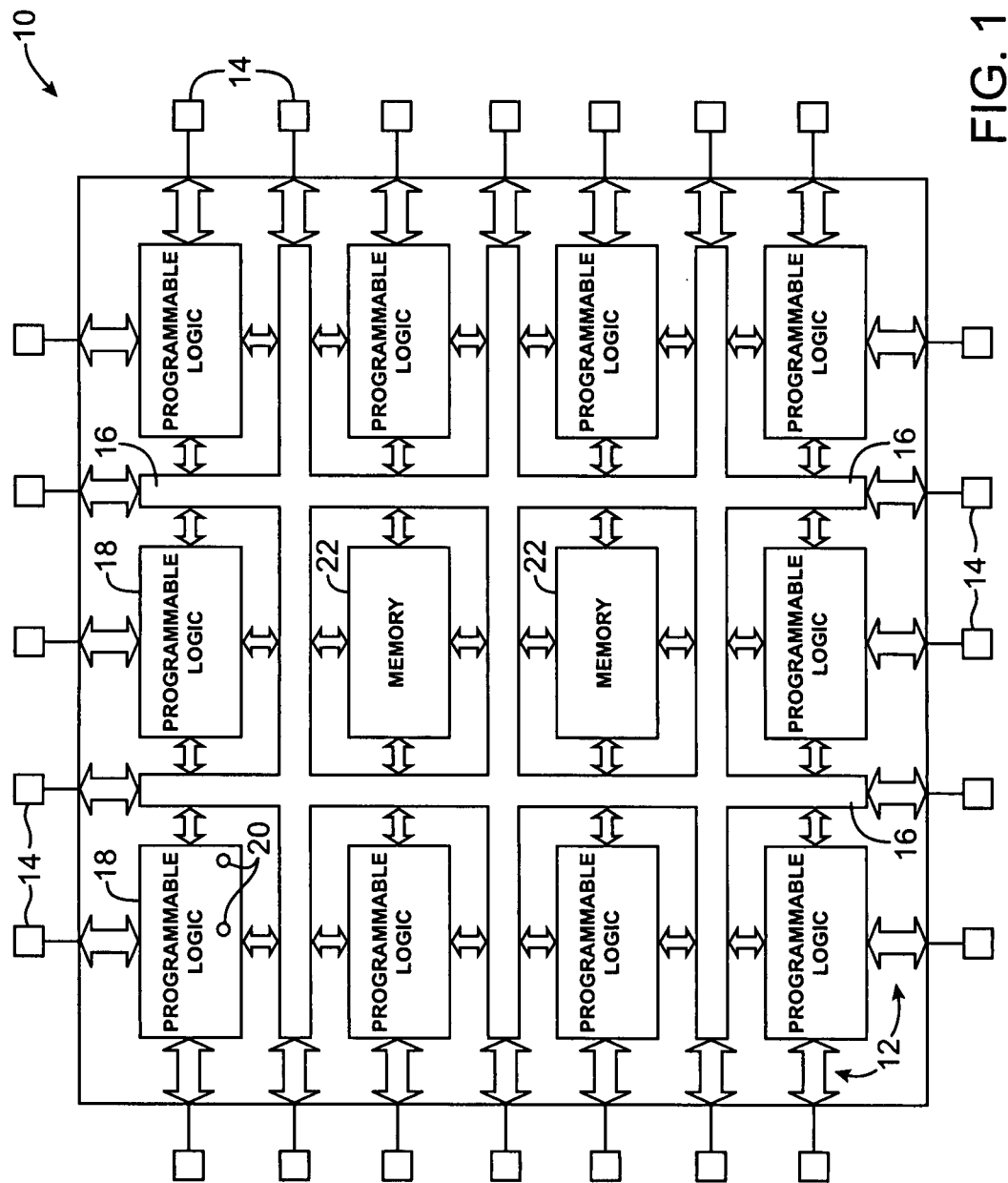
FIG. 1 is a diagram of an illustrative programmable logic device integrated circuit in accordance with the present invention.

An illustrative programmable logic device 10 in accordance with the present invention is shown in FIG. 1.

Programmable logic device 10 has input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include conductive lines and programmable connections between respective conductive lines and are therefore sometimes referred to as programmable interconnects 16.

Programmable logic device 10 contains programmable logic 18 and memory blocks 22.

Programmable logic 18 may include combinational and sequential logic circuitry. The programmable logic 18 may be configured to perform a custom logic function. The programmable interconnects 16 may be considered to be a type of programmable logic 18.

Programmable logic device 10 contains programmable memory elements 20. Memory elements 20 can be loaded with configuration data (also called programming data) using pins 14 and input/output circuitry 12. Once loaded, the memory elements each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory or configuration RAM.

Memory blocks 22 contain arrays of volatile memory elements such as random-access-memory (RAM) cells. The memory blocks 22 are used to store data signals during normal operation of device 10. The memory blocks 22 need not all be the same size. For example, small, medium, and large memory blocks 22 may be included on the same programmable logic device. There may, for example, be hundreds of small memory blocks each having a capacity of about 512 bits, 2-9 large memory blocks each having a capacity of about half of a megabit, and an intermediate number of medium size memory blocks each having a capacity of about 4 kilobits. These are merely illustrative memory block sizes and quantities. In general, there may be any suitable size and number of memory blocks 22 on device 10. There may also be any suitable number of regions of programmable logic 18.

During normal use in a system, memory elements 20 are generally loaded with configuration data from a configuration device integrated circuit via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass transistors, parts of multiplexers (e.g., multiplexers used for forming routing paths in programmable interconnects 16), look-up tables, logic arrays, AND, OR, NAND, and NOR logic gates, etc.

During testing, configuration data is generally loaded into memory elements 20 from a tester.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, the device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

In accordance with the present invention, the programmable logic resources of programmable logic devices such as device 10 are configured to implement at-speed memory test circuitry. The circuitry uses a built in self test circuit to generate test signals for a memory block under test. The memory test circuitry contains signal paths that route signals from the memory block under test to one or more other memory blocks that serve as shadow memory. Bit-mapped memory test data is stored in the shadow memory. Memory test results can be analyzed on the programmable logic device that is being tested with an on-chip comparator or may be analyzed off chip.

Figure 2:
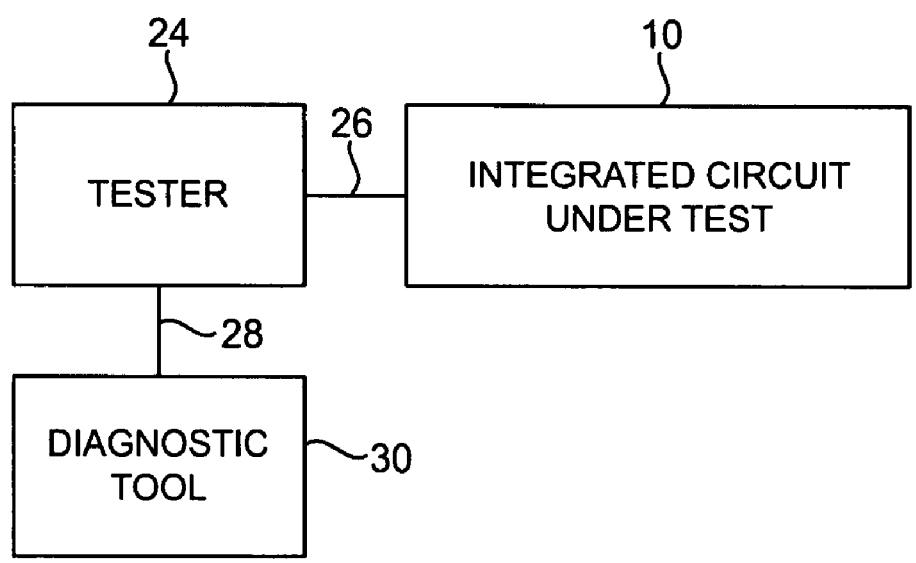
FIG. 2 is a diagram of an illustrative test environment in which programmable logic device integrated circuit at-speed bit-mapped memory tests are performed in accordance with the present invention.

A system environment of the type that may be used during test operations is shown in FIG. 2. A programmable logic device integrated circuit 10 or other integrated circuit under test is connected to a tester 24 using test path 26. The device being tested, which is sometimes referred to as the device under test, may be an unpackaged integrated circuit such as a circuit in an undiced wafer or may be a packaged integrated circuit. Tester 24 has an appropriate test fixture for making electrical connections with the pins 14 of device 10 during testing.

To perform a test, tester 24 applies power to device 10 through power pins. Test configuration data is loaded into configuration memory 20 in device 10 through path 26. The configuration data configures the programmable logic of device 10 for testing. For example, the configuration data configures the programmable interconnects 16 of device 10 to form signal routing paths that are needed to route test data to and from memory block circuitry to be tested. As tests are performed, test data is generated on device 10. Device 10 may use internal circuitry to perform test analysis operations. For example, device 10 may be programmed to implement a comparator that compares expected test data to test data read from a memory block under test. By comparing the memory data that has been read from the memory block to the expected data, the comparator can determine which bits of the memory block are not performing properly. Test analysis may also be performed externally. For example, test data can be provided to a diagnostic tool 30 via path 26, tester 24, and path 28. Tools such as tester 24 and tool 30 are typically implemented using computers loaded with testing software.

Tests are preferably run at speed. At-speed tests are performed at a normal clock speed or at a speed that is at least sufficient to ensure that the memory faults that are likely to be encountered during normal use are exercised. The minimum clock speed that is required to fully exercise memory block faults is sometimes referred to as a "functional" clock speed. With one suitable approach, testing is performed at the highest clock speed allowed when operating the memory normally in a system. Testing at the highest normal clock speed is sometimes preferred, because elevated speeds reveal faults that might not appear at slower clock speeds. To accommodate the at-speed test data, test data may be stored in an otherwise unused memory block on device 10. This otherwise unused memory is preferably configured to have the same size as the memory under test and is sometimes referred to a shadow memory.

With conventional testing techniques, test results are stored on a programmable logic device under test in a relatively small number of error latches. Because the number of bits that can be stored in the error latches is much smaller than the size of the memory block under test, conventional error latch arrangements are unable to store bit-mapped data for an entire memory block.

Figure 3:
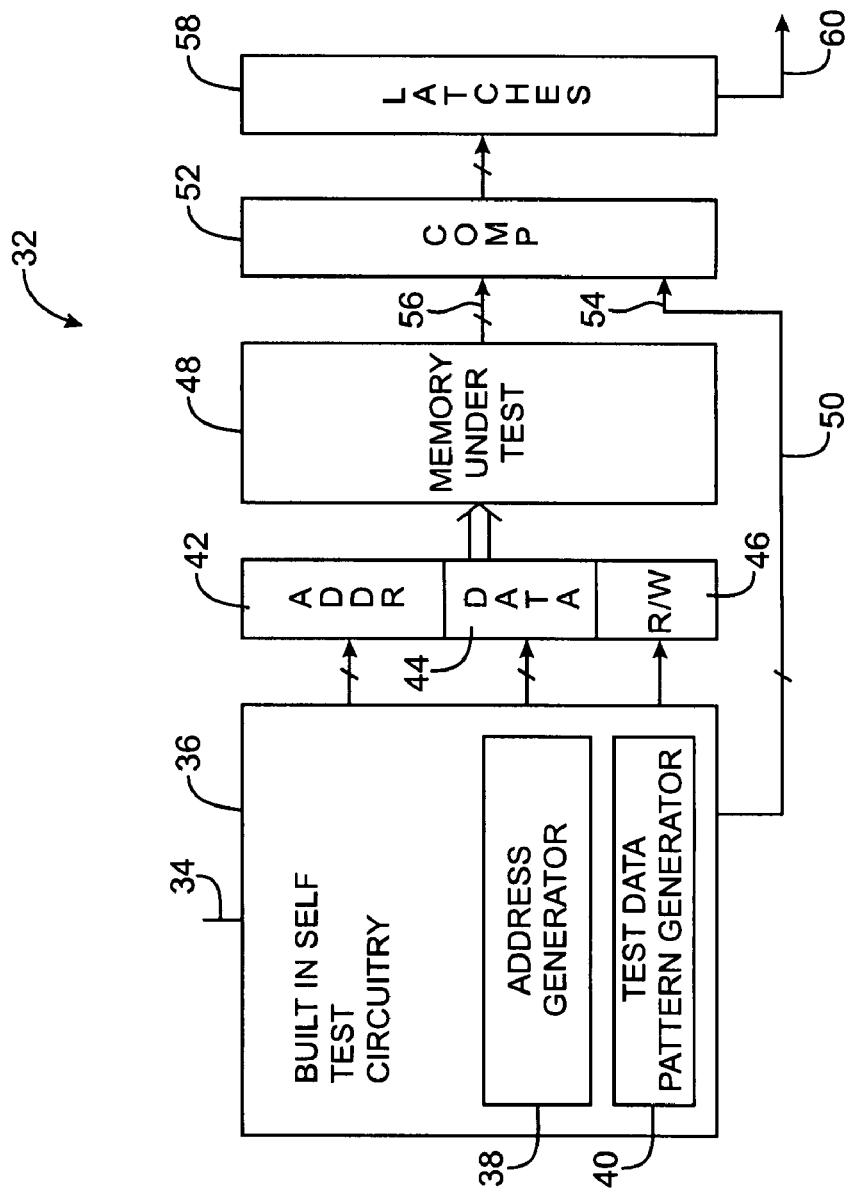
FIG. 3 is a diagram of a conventional programmable logic device memory test circuit.

A conventional programmable logic device memory block test circuit 32 is shown in FIG. 3. With the arrangement shown in FIG. 3, programmable logic on the device under test is configured to form built in self test circuitry 36. A tester supplies control signals to built in self test circuitry 36 via input 34. Built in self test circuitry 36 generates address signals using address generator 38. Test data pattern generator 40 is used to generate test data.

The address signals from address generator 38 are applied to address decoder 42. Address decoder 42 decodes the address signals from address generator 38 and applies corresponding decoded address signals to the memory block 48 that is being tested.

Test data from test data pattern generator 44 is applied to data logic 44. Data logic 44 supplies the data signals to memory 48 on appropriate bit lines.

Read-write enable logic 46 receives a read-write control signal from the built in self test circuitry. The read-write control signal is used to place memory 48 in write mode or read mode. In write mode, test data patterns from test data pattern generator 40 are loaded into the memory. In read mode, the loaded data is read out from the memory.

In a typical test, built in self test circuitry 36 asserts a write enable signal to place memory 48 in write mode. Using address generator 38 and test data pattern generator 40, built in self test circuitry 36 systematically steps through all of the memory addresses for memory 48 multiple times in ascending and descending directions while simultaneously loading data test patterns of appropriate bit lengths into memory 48. Tests are sometimes referred to based on the number of times each memory location is tested (the number of "march steps" in the test). For example, a test in which each memory location is visited ten times is sometimes called a "10n" test, whereas a test in which each memory location is visited twenty times is sometimes called a "20n" test.

Comparator circuitry 52 is used to compare data that is read out from memory 48 to expected data values. If the data that is read out from memory 48 matches the values of the data that was loaded into memory 48, no errors have occurred. If, however, the data does not match, the comparator circuitry 52 generates error signals.

In a typical data comparison process, built in self test circuitry 36 asserts a read enable signal to place memory 48 in read mode. Built in self test circuitry 36 then systematically steps through the memory addresses for memory 48. As each address is generated, a corresponding data word is read from memory 48 and is provided to comparator circuitry 52 at input 56. At the same time, test data pattern generator 40 generates the test data that is associated with each address and provides this test data to input 54 of comparator 52 over path 50.

The data read from memory 48 and received by comparator circuitry 52 at input 56 represents the data that was actually unloaded from memory 48 during the test. The data generated by test data pattern generator 40 and received by comparator circuitry 52 at input 54 represents the expected values of the test data that would result in the absence of error.

Comparator circuitry 52 contains comparators that compare the bits of the actual data word on input 56 to the expected data word on input 54 in parallel. The output of each comparator is high if there is a mismatch between the actual and expected bit. The output of each comparator is low if the value of the data bit read out from the memory is as expected.

The error signals from comparator circuitry 52 are stored in corresponding error latches 58. The number of latches 58 matches the number of comparators in comparator circuitry 52. If, for example, testing is performed on eight-bit words, comparator circuitry 52 will contain eight comparators and latches 58 will contain eight corresponding latches. Because there are many more tests performed on memory 48 than there are bits in latches 58, each latch contains feedback circuitry. The feedback circuitry presents the current value of the latch to a logical OR gate at its input. The other input to the logical OR gate is the output of a corresponding comparator. Using this arrangement, multiple tests are performed. If any of the tests results in an erroneous bit, the output of the comparator in the same bit position as the erroneous bit goes high. This high signal is presented to the logical OR gate in the latch at the same bit position. At the end of the test, the contents of the latches 58 indicates the general location of errors in the memory 48.

In a test scenario in which test data is handled in eight-bit words, for example, the output of latches 58 might be {0, 1, 0, 0, 0, 0, 0, 1}. This result would indicate that an error occurred in the second bit of one of the test words and that an error occurred in the eighth bit of one of the test words. The identity of the particular test words and therefore the address of the corresponding location in memory 48 where the error occurred is obscured. Without complete address and bit position information, it is not possible to create a bit map for the errors in memory 48. Detailed error information is therefore lost. For example, the high bit in the second bit position might have resulted from a stuck-at-one fault that was detected in the seventh visit to a particular address or might have resulted from a stuck-at-zero fault in the third visit to a different address. There is no way to sort out these potentially disparate causes of the error using the arrangement of FIG. 3, because no address information or fault type information is retained during the test. Only the bit position of the error is retained.

This type of conventional testing technique may be acceptable in certain applications such as redundancy applications in which it is only necessary to determine which bank of memory contains an error or pass-fail tests in which it is only necessary to determine whether a device contains an error or is error free. However, debugging and yield enhancement operations require more information.

A potential way to improve memory test coverage involves using the conventional arrangement of FIG. 3 to perform multiple tests, each of which only attempts to cover a single test word at a single known address. After each test, the data captured in the latches 58 is analyzed. Because only a single word is tested at a time, the test results are not obscured by the feedback operation of latches 58. This type of approach is extremely slow, because it is necessary to unloaded the latches between each test. Moreover, certain faults only appear after two or more successive at-speed clock cycles. For example, a fault might appear only after two normal clock rate read operations have been performed or a fault might appear only when a normal clock rate write-read-write sequence is performed. Interrupting the test process after each write operation to read out the data from the latches creates an abnormally long recovery time for the memory. Under these conditions, the error may disappear, making it impossible to properly debug the memory.

Figure 4A:
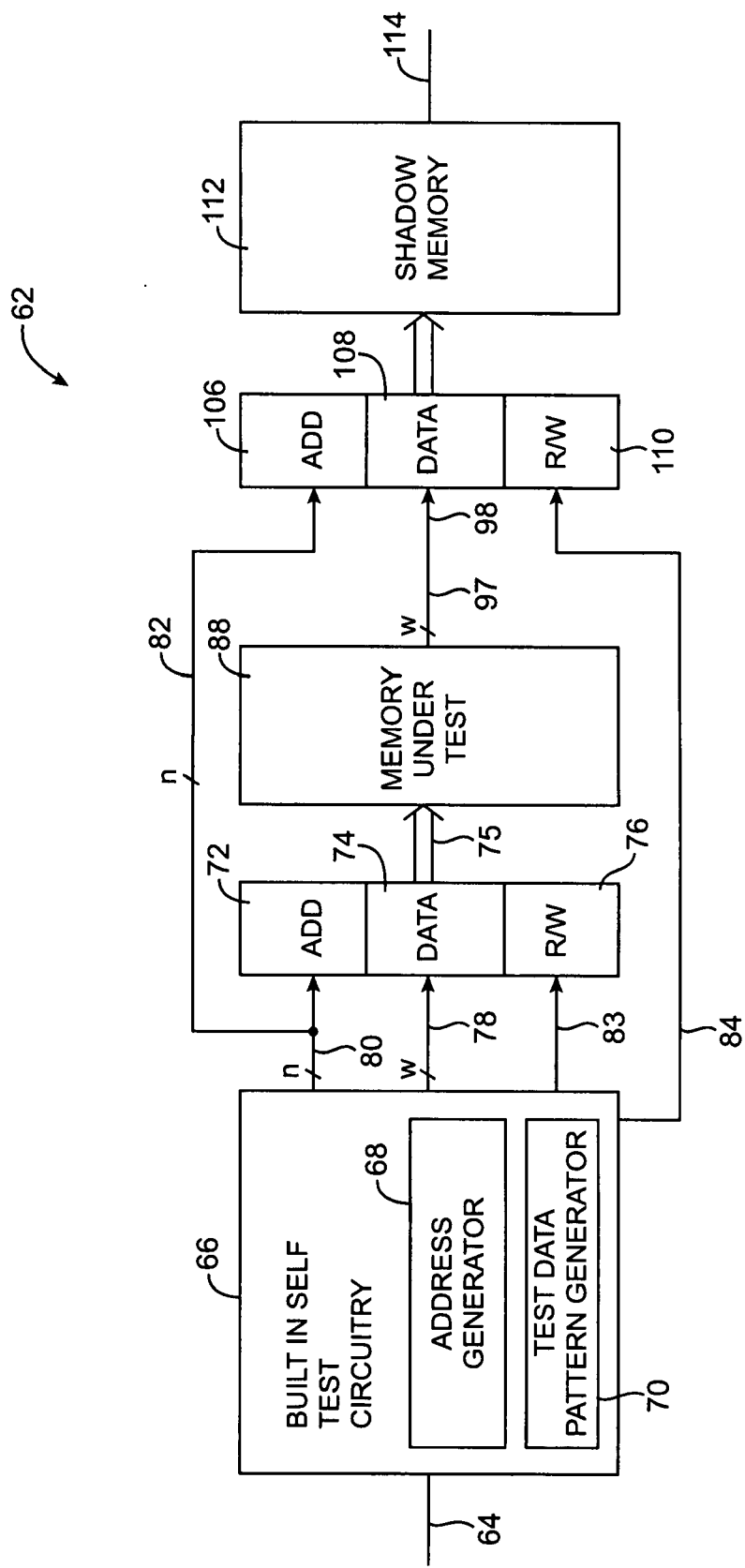
FIGS. 4A and 4B are diagrams of illustrative at-speed bit-mapping programmable logic device memory testing circuitry in accordance with the present invention.
Figure 4B:
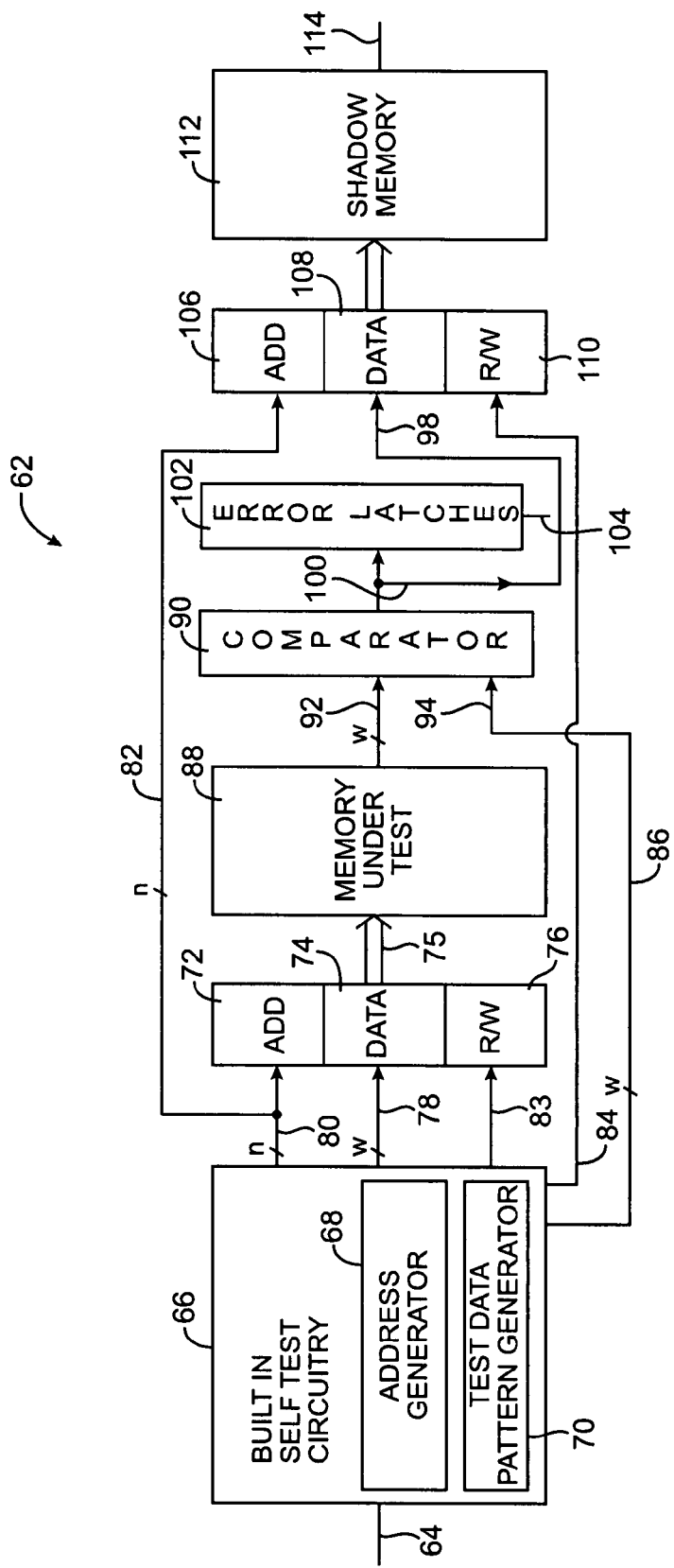

Memory block diagnostics circuitry 62 in accordance with the present invention is shown in FIGS. 4A and 4B. In the arrangements shown in FIGS. 4A and 4B, the programmable logic 18 of the programmable logic device under test has been configured to implement diagnostic circuitry such as built in self test circuitry 66.

There are two memory blocks in circuitry 62. Memory block 88, which is sometimes referred to as the memory under test, is the block of memory being tested. Memory block 112, which is sometimes referred to as shadow memory, is used to store test results gathered from testing memory 88.

Signal paths for routing test signals are formed in circuitry 62 using programmable interconnects 16. For example, programmable interconnects 16 are used to form a path 64 between pins 12 and built in self test circuitry 66. Programmable interconnects 16 are also used to form a path 114 between shadow memory 112 and pins 12. The pins 12 that are connected to paths 64 and 114 are connected to an external tester 24 (FIG. 2). Path 64 is used to convey control signals to circuitry 62 from tester 24. Path 114 is used to convey test results to tester 24.

Built in self test circuitry 66 generates address signals using address generator 68. Test data pattern generator 70 is used to generate test data. Any suitable address signals and test data may be generated to test the performance of memory block 88. The test patterns that are used during testing depend on the memory architecture used for memory block 88 and the design of the memory cells within block 88. Examples of test patterns include patterns of all logic ones, all logic zeros, checkerboard patterns of ones and zeros, etc. Defects that may be revealed through testing include stuck-at-one faults in which a cell becomes stuck at a logical one value (e.g., a high signal such as Vcc), stuck-at-zero faults in which a cell becomes stuck at a logical zero value (e.g., a low or ground signal such as Vss), and coupling faults in which a cell's content is improperly influenced by the content of adjacent cells. Effective debugging and yield enhancement requires that these faults be identified and located in memory block 88. If, for example, a row of stuck-at-one faults is identified, it may be necessary to change the layout of a power supply line (as an example). By producing a bit-map diagram of the faults (errors) in memory block 88, design changes can be made to the programmable logic device integrated circuit 10 to improve performance.

During testing, the address signals from address generator 68 are supplied on path 80. There may be, for example, n parallel address lines in path 80 that are used to convey an n-bit address signal. The address signal on path 80 is applied to the input of address decoder 72. Path 82 is used to simultaneously route the same address signals to the address decoder 106 that is associated with shadow memory 112.

Address decoder 72 decodes the address signals from address generator 68 and applies corresponding decoded address signals to the memory block 88 that is being tested. At the same time, address decoder 106 decodes the address signals and applies corresponding address signals to the shadow memory 112. Shadow memory block 112 may be any suitable memory block. For example, memory block 112 may be a memory block on the programmable logic device 10 that is adjacent to memory block 88. If desired, memory block 112 may be located elsewhere on the programmable logic device 10, although care should be taken that the address path 82 and other paths that are formed between the memory blocks of FIGS. 4A and 4B have a sufficient bandwidth to handle at-speed clock rates. In a typical test, the test clock rate is a normal clock rate that would be used to operate the programmable logic device in a system. If desired, a different clock rate may be used, provided that the clock is at least fast enough to exercise the types of error being debugged. This lower bound on the clock rate, which is sometimes referred to as the functional clock rate, may be somewhat less than the normal clock rate.

The built in self test circuitry 66 may use test data pattern generator 70 to generate test data. The test data is provided to memory 88 via path 78 and data logic 74. Path 78 may, for example, contain w parallel lines for conveying a w-bit test data word to data logic 74. Data logic 74 may have a w-bit input for receiving the test data. Data logic 74 provides the w-bit test data words to the memory cells of memory 88 using data lines (sometimes referred to as bit lines). The number of address lines and bit lines associated with each memory block on programmable logic device 10 depends on the physical layout scheme used for the array of memory cells in that memory block.

Read-write enable logic 76 and read-write enable logic 110 receive read-write control signals from built in self test circuitry 66 over paths 83 and 84. The read and write enable signals are used to place memory 88 in write mode or read mode and to place memory 112 in write mode or read mode as desired. For example, to load test data from test data pattern generator 70 into memory 88, memory 88 is placed in write mode. To read the data that has been loaded into memory 88, memory 88 is placed in read mode. Paths such as read-write enable paths 83 and 84, address path 82, and data paths 86, 97, 100, 104 and the other data paths of FIGS. 4A and 4B may be formed from programmable logic.

The memory 88 may be tested by gathering and analyzing test results after the entire array 88 has been loaded with test data, after regions of memory 88 have been loaded with test data, after each test word is written to array 88, using a combination of these approaches, or using any other suitable testing arrangement. The choice of which pattern of reads and writes to use during testing depends on the type of memory architecture being used and the types of faults being investigated. Illustrative approaches in which the entire memory 88 is loaded with test words before data read operations are preformed are sometimes described herein as an example.

In a typical test using the circuitry 62, built in self test circuitry 66 asserts a write enable signal to place memory 88 in write mode. Using address generator 68 and test data pattern generator 70, built in self test circuitry 66 systematically steps through all of the memory addresses for memory 88 while simultaneously loading test data patterns of appropriate bit lengths into memory 88. The test data loading process takes place at speed (e.g., at a clock speed that would normally be used when operating the programmable logic device 10 in a system).

After the memory 88 has been loaded with test data, the built in self test circuitry 66 places the memory 88 into read mode. The data that was loaded into memory 88 is then read out for analysis.

With one suitable approach, which is shown in FIG. 4A, test data is analyzed off chip. Initially, data that is read out of memory 88 is written to shadow memory 112 using path 97 and input 98 of data logic 108. During this process, path 82 is used to pass the same address signals that are applied to address decoder 72 to address decoder 106. As a result, each w-bit data word that is read from memory 88 is stored in shadow memory 112 at a location that matches the location from which it was read in memory 88. This produces a bit map of the data read from memory 88. The test results bit map stored in shadow memory 112 can be uploaded to diagnostic tool 30 (FIG. 2) via path 114 and tester 24 for analysis. During the analysis process, diagnostic tool 30 uses information on test patterns that were generated by test data pattern generator 70 of circuit 62 to determine which bits in the data from shadow memory have been corrupted. Corrupted bits indicate corresponding errors (faults) in memory 88.

With another suitable approach, which is shown in FIG. 4B, the test data values that are read from memory 88 are compared to the expected values of the test data using on-chip circuitry such as comparator circuitry 90. During these read operations, built in self test circuitry 66 uses address generator 68 to generate addresses for memory 88 and shadow memory 112. Comparator circuitry 90 receives the w-bit data words that have been addressed and read from memory 88. The w-bit data words from memory 88 are received by comparator circuitry 90 at input 92. At the same time, test data pattern generator 70 generates the same test data patterns that were used when writing to memory 88. These expected test data patterns are provided to comparator 90 using path 86 and input 94. The value of each data bit read from memory 88 and received at input 92 is compared to the corresponding expected data bit that is provided by test data pattern generator 70 and received at input 94.

Comparator circuitry 90 contains multiple comparators. Each comparator processes a corresponding one of the w bits of test data. If the data in one of the bit positions on input 92 successfully matches the data at the corresponding bit position on input 94, no error has occurred and the comparator circuit associated with that bit position may produce a logical zero output. If the data values in a given bit position on input 92 and input 94 do not match, an error has occurred and the comparator circuit for the given bit position may be taken high.

As the address generator 68 is used to systematically step through the memory addresses for memory 88, comparator circuitry 90 compares the test data words read out from memory 88 to the expected test data words on path 86 and produces comparison results. These results are provided to input 98 of data logic 108 via path 100 while address logic 106 receives the memory addresses from address generator 68. The read-write enable logic 110 is used to place shadow memory 112 in write mode, so that the comparison results from comparator 90 are written into shadow memory 112. The read addresses provided to address decoder 72 are the same as the write addresses provided to address decoder 106 during each comparison, so the comparator output signals (w-bit test result words) on path 100 are written into memory 112 in addresses that match the addresses being used to read the data from memory 88. The comparison results stored in shadow memory 112 therefore form a bit map of the errors in memory 88. After at-speed testing of memory 88 is complete, the contents of shadow memory 112 (i.e., the test results bit map) may be uploaded to tester 24 (FIG. 2) via path 114 (e.g., at a relatively slow rate).

If desired, the results of the data comparison operations performed by comparator circuitry 90 may be stored in error latches 102. There is preferably an error latch 102 for each bit of comparison data produced by comparator circuitry 90. For example, if comparator circuitry 90 includes w parallel comparators, each of which compares data for a respective bit position in the words presented on inputs 92 and 94, error latches 102 may contain w parallel latches, each of which receives a respective comparator output. Error latches 102 may include individual latches with feedback circuitry. The feedback circuitry feeds back the current value of each latch's output to an OR gate at its input. The other input to the OR gate is the output of a corresponding comparator in comparator circuitry 90. Using this arrangement, multiple tests are performed. If any of the tests results in an erroneous bit, the output of the comparator in the same bit position as the erroneous bit goes high. The high signal is presented to the input of the OR gate in the latch at the same bit position. At the end of the test, the content of the latches 102 serves as a record that indicates the general location of errors in the memory 88 (e.g., a memory bank location in which at least one error has occurred), as described in connection with the diagnostic circuit 32 of FIG. 3. The test results in the error latches 102 may be uploaded to tester 24 using paths such as path 104.

Figure 5:
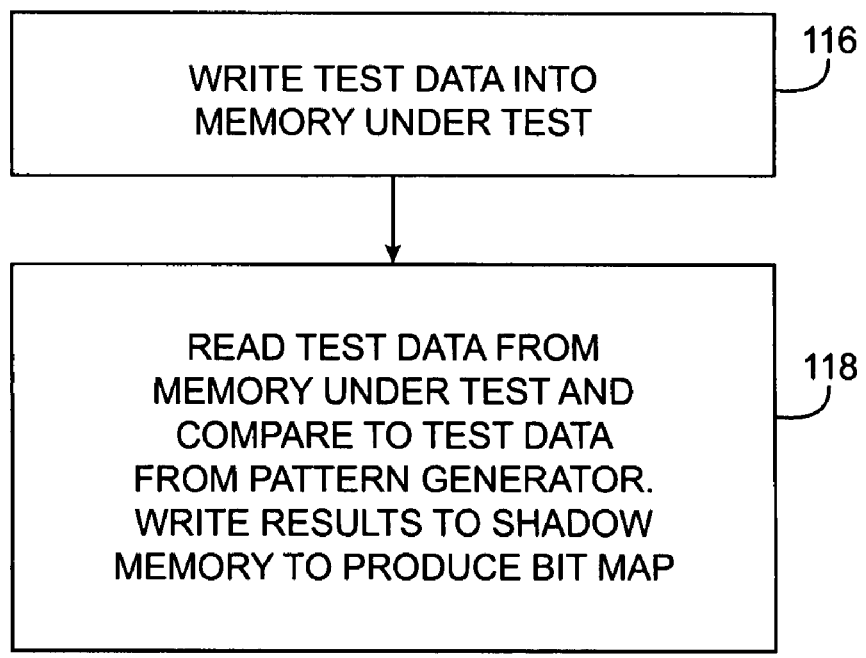
FIG. 5 is a flow chart of illustrative steps involved in performing at-speed bit-mapped memory tests using the comparator circuitry of FIG. 4B in accordance with the present invention.

Illustrative steps involved in using an on-chip comparison approach in testing memory 88 with circuitry 62 of FIG. 4B are shown in FIG. 5.

At step 116, built in self test circuitry 66 writes test data into the memory under test 88. Read-write enable logic 76 is used to place memory 88 in write mode. Data logic 74 is used to direct data words received on data lines 78 to appropriate lines in memory 88. Address decoder 72 receives address signals on address path 80 and generates corresponding address signals that are applied to memory 88 on address lines. The data lines and address lines used to control the memory cells in memory 88 are depicted as path 75 in FIGS. 4A and 4B.

At step 118, the built in self test circuitry 66 generates address signals that are provided to address decoder 72. Corresponding data words are provided on path 86. The data words that are provided on path 86 are the same data words that were applied to data logic 74 during write operations and therefore represent the data that should have been loaded into memory 88 in the absence of error. The expected data on path 86 is provided to comparator circuitry 90 via input 94. The read-write enable circuitry 76 is used to place the memory array 88 in read mode. As the address signals are applied to memory 88 by the address decoder, data is read from memory 88 and is provided to input 92 of comparator 90. Comparator 90 makes a bit-wise comparison of each data word read from memory under test 88 and the corresponding expected data word provided by built in self test circuitry 66 to produce comparison words indicative of faults in the memory under test. The comparison results produced by comparator circuitry 90 are provided to shadow memory 112 via path 100, input 98, and data logic 108. Read-write enable logic 110 is used to enable shadow memory 112 for writing. As the address signals on path 82 are supplied to address decoder 106 and corresponding decoded address signals are applied to shadow memory 112, the data logic 108 writes the comparison result data words into shadow memory 112. Because the addresses used to read each data word from memory 88 are the same as the addresses simultaneously used in writing the comparison data words to memory 112, the results stored in memory 112 form a bit map of the errors in memory 88.

Although shown as separate steps in the example of FIG. 5, the write operations of step 116 and the read operations of test 118 may be intermixed (e.g., if it is desired to exercise memory 88 with a particular read-write pattern). It is not necessary to write to the entire memory 88 before data is read from memory 88.

Figure 6:
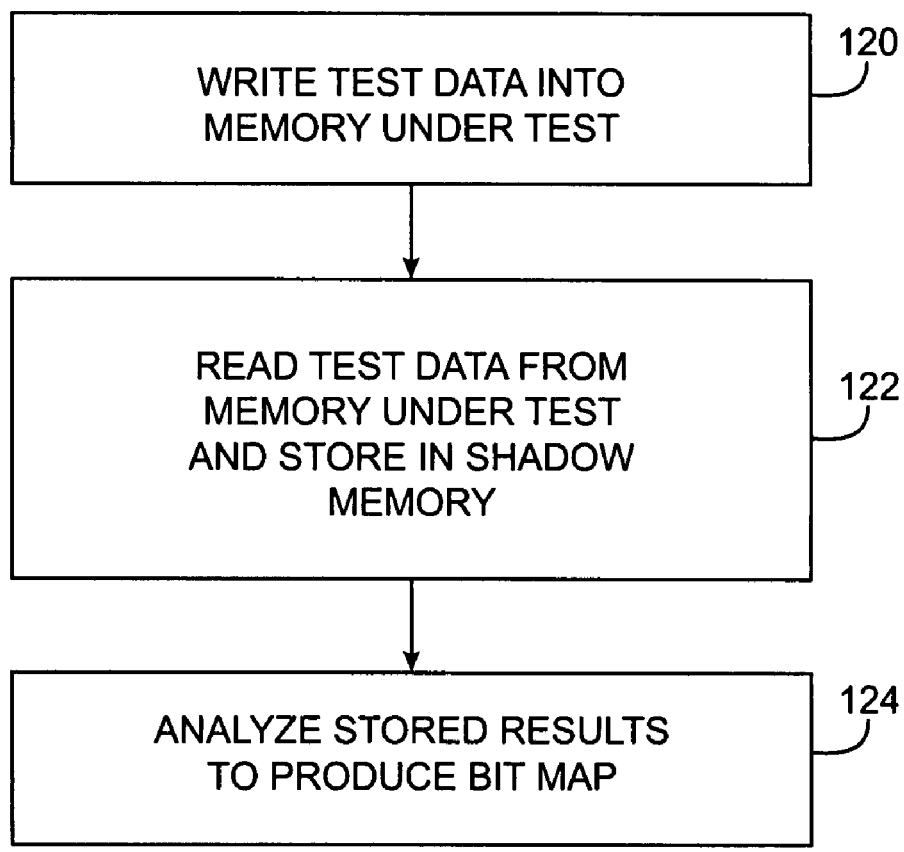
FIG. 6 is a flow chart of illustrative steps involved in performing at-speed bit-mapped memory tests without using the comparator circuitry of FIG. 4A in accordance with the present invention.

Illustrative steps involved in using an off-chip comparison approach in testing memory 88 with circuitry 62 of FIG. 4A are shown in FIG. 6.

At step 120, built in self test circuitry 66 writes test data into the memory under test 88. Built in self test circuitry 66 directs read-write enable logic 76 to place memory 88 in write mode. Data logic 74 routes data words received on data lines 78 to data lines in memory 88. Address decoder 72 receives undecoded address signals on address path 80 and generates corresponding decoded address signals. The decoded versions of the address signals are used to address memory 88.

At step 122, while the built in self test circuitry 66 generates address signals, corresponding data words are read out of memory 88 (e.g., in w-bit words). The data that is read out of the memory 88 is routed to input 98 of data logic 108 via path 97. The data that is received at input 98 is written into shadow memory 112 at address locations that match the address locations from which the data was read in memory 88.

Although shown as separate steps in the example of FIG. 6, the write operations of step 120 and the read operations of test 122 may be intermixed (e.g., if it is desired to exercise memory 88 with a particular read-write pattern). It is not necessary to write to the entire memory 88 before data is read from memory 88.

At step 124, the contents of the shadow memory 112 is uploaded to tester 24 (FIG. 2) via path 114. The tester 24 provides the memory from the shadow memory to diagnostic tool 30. Diagnostic tool 30 uses information on the data patterns that were loaded into memory 88 during the test to determine which of the shadow memory bits have been corrupted. From this analysis, the diagnostic tool 30 produces a bit map of the errors in memory 88.

If desired, two or more shadow memory blocks may be used to store test data from the memory under test. This type of arrangement may be used, for example, when it is desired to store test results using two shadow memory blocks each of which is half of the size of the memory block under test. Diagnostic circuitry 62 in which two shadow memory blocks are used to store test results is shown in FIGS. 7A and 7B.

Figure 7A:
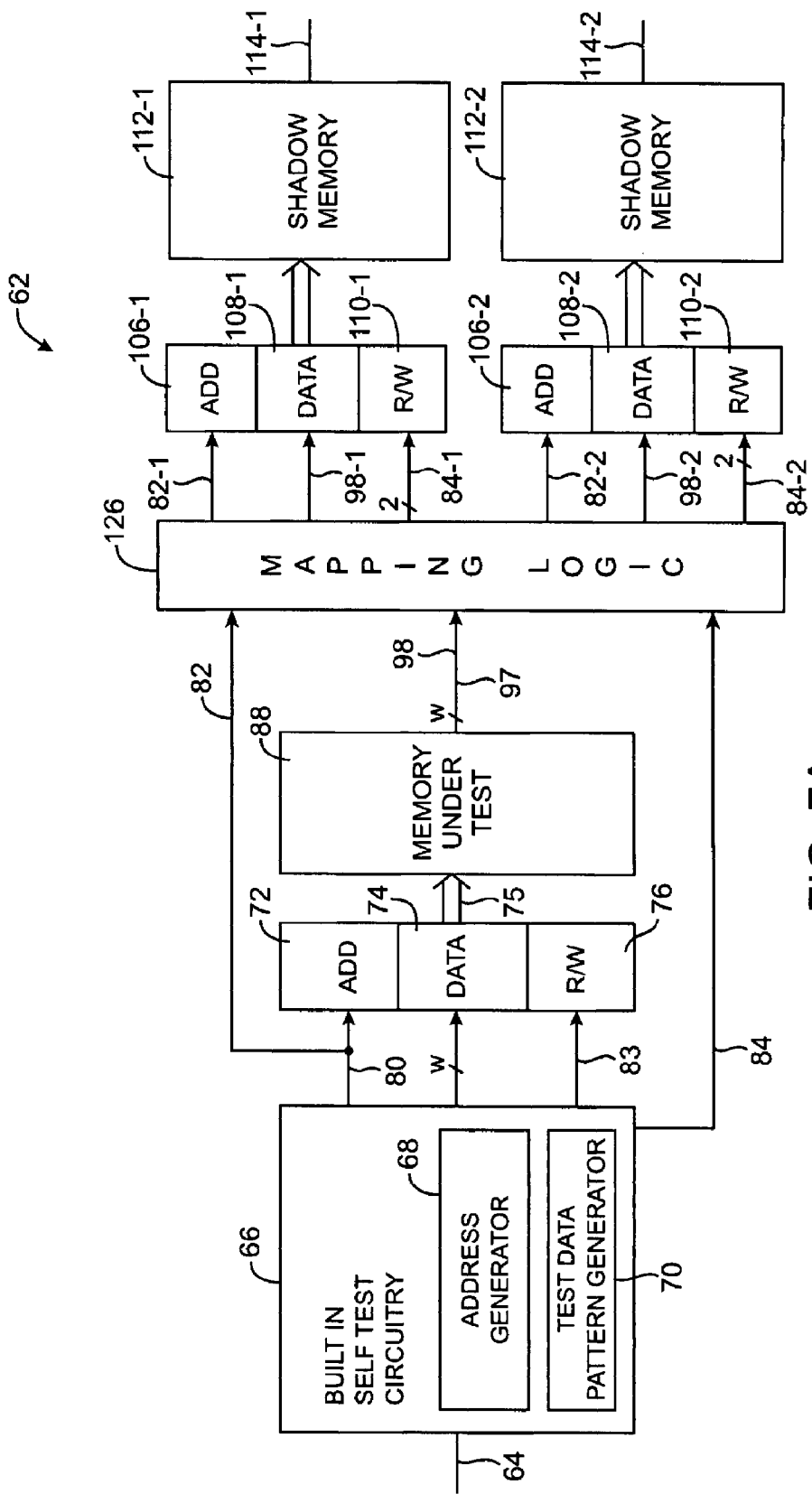
FIGS. 7A and 7B are diagrams of illustrative testing circuitry using mapping logic and two shadow memory blocks to capture at-speed bit-mapped memory tests results from a memory block that is under test in accordance with the present invention.
Figure 7B:
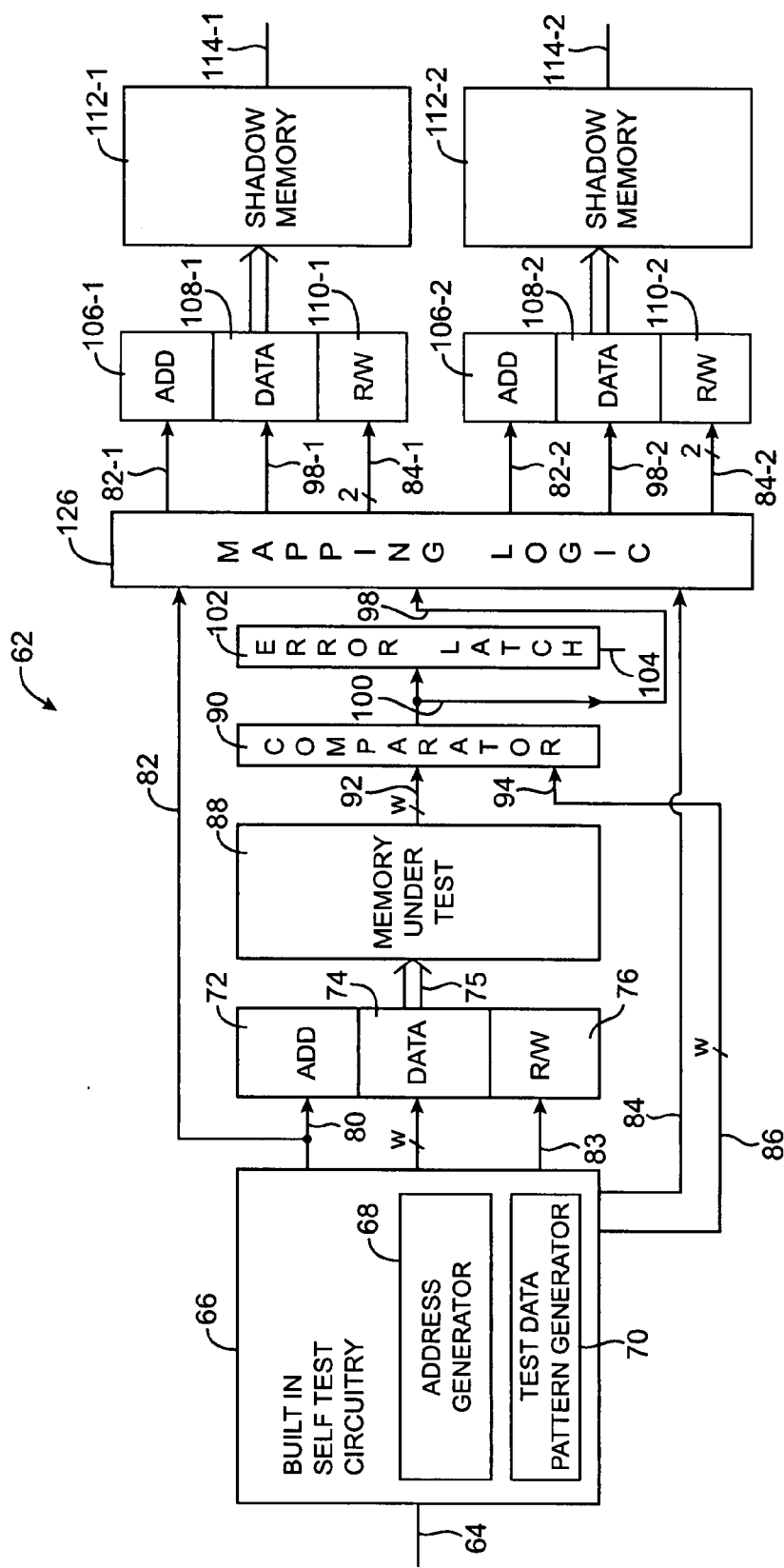

As shown in FIGS. 7A and 7B, the single shadow memory block 112 of FIGS. 4A and 4B has been replaced with shadow memory block 112-1 and shadow memory block 112-2. Test results from shadow memory block 112-1 may be uploaded to tester 24 using path 114-1. Path 114-2 may be used to upload test results from shadow memory block 112-2. Memory blocks 112-1 and 112-2 each contain half (or at least half) of the number of memory cells in memory block 112 of FIGS. 4A and 4B.

Mapping logic 126 is used to map the address and data signals from built in self test circuitry 66 to shadow memory 112-1 and 112-2. The built in self test circuitry 66 generates address signals that are provided to the mapping logic 126 via address path 82. The mapping logic 126 converts each address received on path 82 into a pair of corresponding addresses. The first address of each pair is provided to address decoder 106-1 of shadow memory 112-1 over address path 82-1. The second address of each pair is provided to address decoder 106-2 of shadow memory 112-2 over address path 82-2.

Mapping logic 126 distributes the read-write enable signals on path 84 to read-write logic 110-1 of shadow memory 112-1 and to read write logic 110-2 of shadow memory 112-2, using respective read-write enable paths 84-1 and 84-2.

Data signals are received by mapping logic 126 at input 98 from either the output of comparator 90 of FIG. 7B (comparison result words) or the output of memory 88 of FIG. 7A (i.e., uncompared data words). Mapping logic 126 divides the received data signals in two equal groups. The first group of data signals is routed to shadow memory 112-1 via data lines 98-1 and data logic 108-1. The second group of data signals is routed to shadow memory 112-2 via data lines 98-2 and data logic 108-2.

In operation, the mapping logic 126, shadow memory 112-1 and 112-2, and the address decoders, data logic, and read-write enable logic associated with shadow memory 112-1 and 112-2 of FIGS. 7A and 7B perform the same functions as the shadow memory 112 and the address decoder, data logic, and read-write enable logic associated with shadow memory 112 of FIGS. 4A and 4B.

Figure 8:
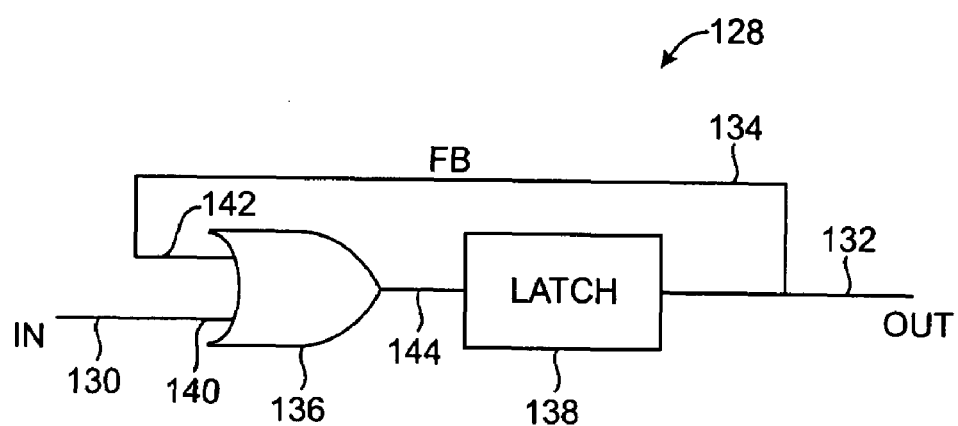
FIG. 8 is a diagram showing how feedback may be used in capturing test results with shadow memory in accordance with the present invention.

If desired, the output of the shadow memory may be provided with feedback circuitry. FIG. 8 shows an illustrative feedback circuit 128. This type of arrangement may be used in error latches 102 or with shadow memory 112 (in which case the memory cells in the shadow memory serve as latches). Circuit 128 has an input 130 and an output 132. Input 130 receives a test result signal such as the output of a comparator 90. With a typical arrangement, the signal on input 130 is a zero if there is no error and is one if an error has been detected. Initially the content of the latch 138 is zero. The signal that is fed back from the output of latch 138 to the input 142 of OR gate 136 via feedback path 134 is therefore also zero. The signal on inputs 142 and 140 are logically combined by OR gate 136 and the resulting output signal is provided on output 144. If, for example, the input signal on input 140 is a zero, the output of OR gate 144 will be zero and the content of latch 138 will remain at a zero. Multiple tests may be performed. As each test is performed, the resulting output signal from the comparator or memory under test is provided to input 130. If any of the test result signals on input 130 are a one, the output 144 will also be a one. This will cause a one to be stored in latch 138. The one will be fed back to input 142 via feedback path 134, so that all subsequent output signals 144 and output signal 132 will be a logical one. The logical one stored in latch 138 serves as a record indicating that an error occurred during one of the tests.

In a typical scenario, the functionality of FIG. 8 is implemented by using the storage capabilities of the shadow memory 112 to serve as latch 138. Moreover, because read and write operations are performed using w-bit data words, w bits of feedback circuitry are provided.

Figure 9:
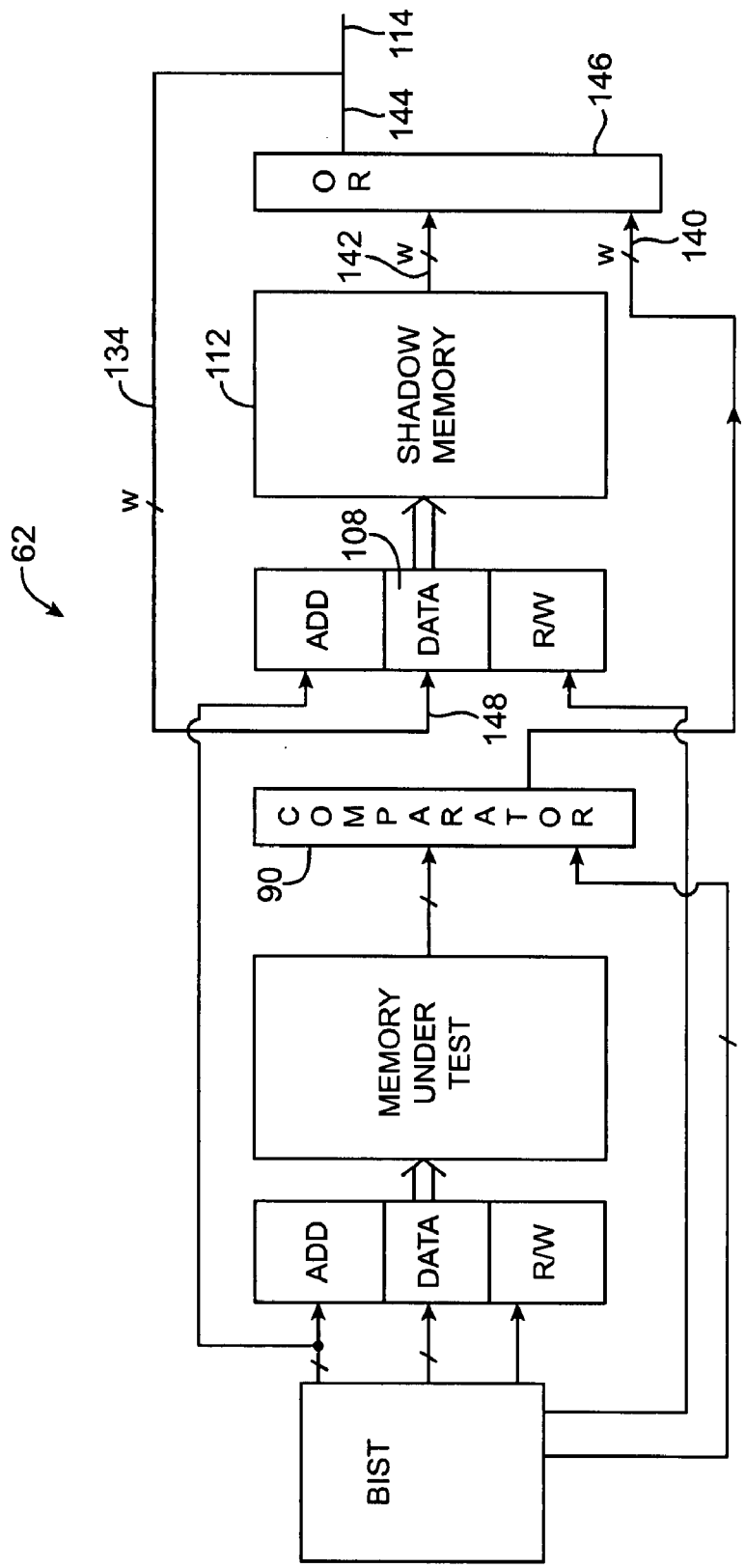
FIG. 9 is a diagram of illustrative shadow memory circuitry with feedback circuitry of the type shown in FIG. 8 that is used in capturing test results in accordance with the present invention.

An illustrative arrangement of this type is shown in FIG. 9. As shown in FIG. 9, the output of shadow memory 112 and the output of comparator circuitry 90 are provided in the form of w-bit words. Each of these output signals is routed to a respective w-bit input of OR logic circuitry 146. The w-bit output of shadow memory 112 is received at the w inputs 142 of circuitry 146. The w-bit output of comparator circuitry 90 is received at the w inputs 140 of OR logic 146. The OR logic 146 contains w OR gates such as OR gate 136 of FIG. 8. The outputs 144 of these OR gates are feed back to the w-bit data input 148 of data logic 108 by w-bit feedback path 134. In operation, the OR logic 146, feedback path 134, and the storage capabilities of shadow memory 112 perform the same test data latching functions described in connection with FIG. 8 for each of the w bits of the test results provided by comparator circuitry 90.

Figure 10:
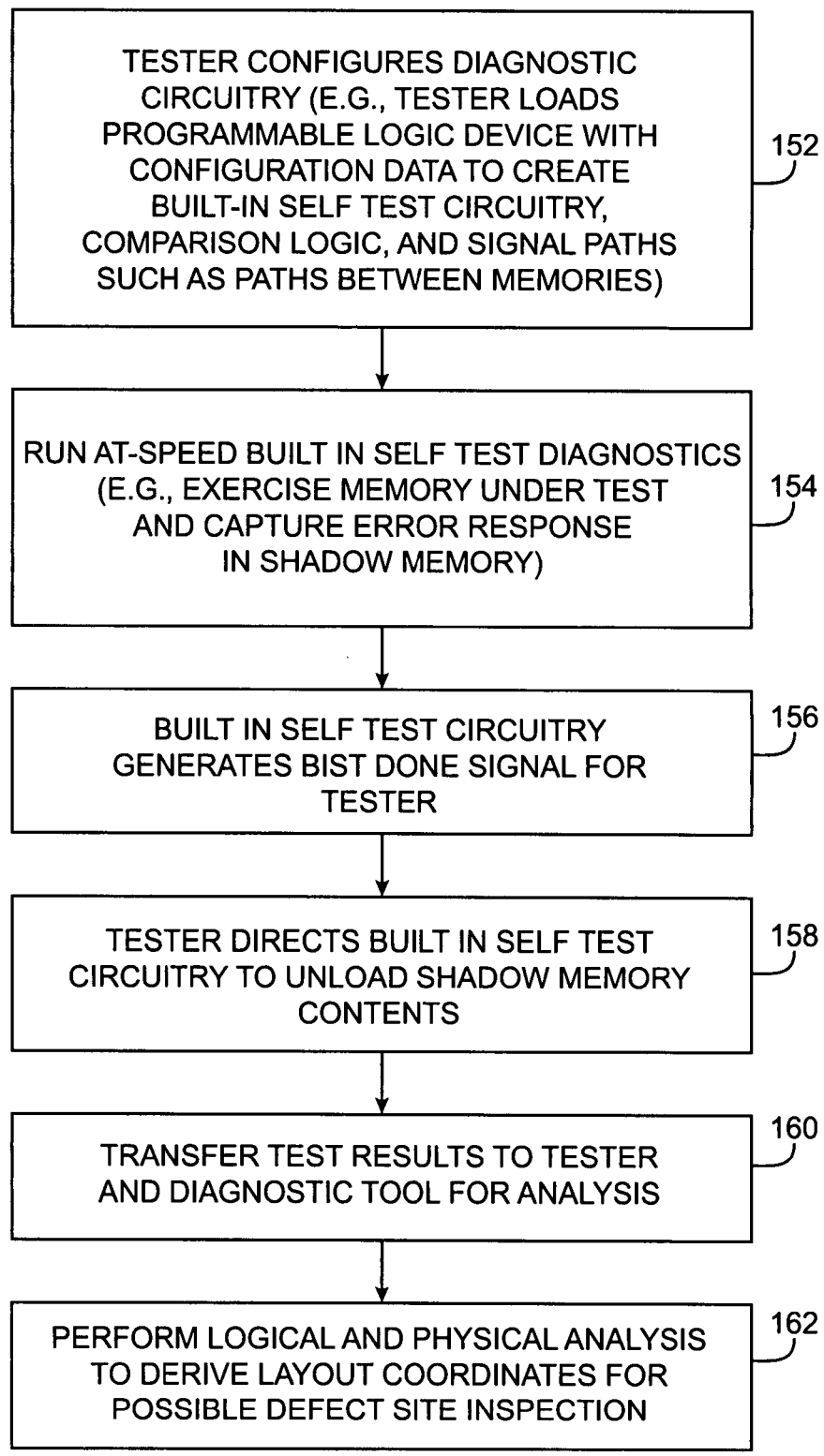
FIG. 10 is a flow chart of illustrative steps involved in using a shadow memory in testing a memory block on a programmable logic device integrated circuit in accordance with the present invention.

Illustrative steps involved in using shadow memory in testing a block of memory 88 on a programmable logic device 10 are shown in FIG. 10.

At step 152, the tester 24 loads configuration data into programmable logic device integrated circuit 10 via path 26 (FIG. 2). The configuration data is loaded into programmable elements 20 (FIG. 1). Once loaded, each programmable element 20 produces an output signal that configures a corresponding portion of programmable logic 18 on the device 10. In a typical scenario, circuitry such as memory under test 88, shadow memory 112, address decoders 72 and 106, data logic 74 and 108, and read-write enable logic 76 and 110 in FIGS. 4A and 4B is formed from hardwired circuitry. The remainder of the circuitry in FIGS. 4A and 4B, including built in self test circuitry 66 and the paths interconnecting the components of FIGS. 4A and 4B is formed from the programmable logic that is configured by the configuration data from the tester. Mapping logic 126 of FIGS. 7A and 7B and OR logic 146 of FIG. 9 may also be formed from programmable logic.

After creating the built in self test circuitry 66 and the appropriate signal paths, tests may be performed at step 154. In particular, the tester 24 may send control signals to the built in self test circuitry 66 that direct the built in self test circuitry 66 to begin generating addresses with address generator 68 and test data patterns with test data pattern generator 70.

In general, any suitable testing may be performed by built in self test circuitry 66.

For example, 1n tests may be performed in which each memory cell in the memory under test is tested once. With this approach, the test data that is collected in shadow memory 112 represents a bit map (complete address and bit position information) of the faults in memory 88. Different fault types can be resolved, because only one test is performed per memory cell before the data is uploaded from shadow memory 112. The memory 88 may be tested one word at a time or memory 88 may be written to and read from in larger blocks.

As another example, 10n tests may be performed using feedback logic of the type described in connection with FIGS. 8 and 9. With a 10n test, each memory bit is tested ten times, with potentially different test signals. Each bit in the shadow memory 112 acts as a latch with a feedback path 134 (FIG. 9) and goes high if any of the ten tests produces a logic one as an output. With this type of functionality, it is not possible to resolve fault types in a 10n test. Nevertheless, when fault type information is not needed, tests with multiple march steps (e.g., 10n, 20n, 40n . . . ) may be performed.

During the testing of step 154, test results may be processed using internal circuitry in device 10 such as comparator circuitry 90, as described in connection with FIG. 5. In on-chip testing, data read from memory 88 and expected data from built in self test circuitry 66 is routed to the two inputs of comparator 90 and corresponding compared data is written into shadow memory. Test results may also be processed externally, as described in connection with FIG. 6. In a typical off-chip processing arrangement, test data that has been gathered using shadow memory 112 is uploaded to an external processing platform such as diagnostic tool 30 (FIG. 2) for analysis.

The shadow memory that is used to capture test results can be implemented as a single block (e.g., a block of memory having the same size as the memory block under test), as two blocks (e.g., two blocks of the type described in connection with FIGS. 7A and 7B), or using more blocks. The size of the shadow memory (whether implemented using a single block or multiple blocks) is preferably equal to the size of the memory block being tested, so that complete address and bit position is retained. This allows test results to be provided in the form of a memory map of memory 88. If desired, however, shadow memory can be used that is smaller than the memory under test. For example, a 512 kilobit memory block may be tested using a 256 kilobit shadow memory, although generation of a bit map with this type of arrangement requires multiple tests (e.g., two half-sized tests interrupted by an upload process).

Testing with the shadow memory at step 154 is preferably performed at speed (i.e., using a clock speed that is within the range of the permissible normal clock speeds that can be used when programmable logic device 10 is used in a system and which is at least as fast as the functional clock speed). As an example, if the memory block being tested is contained within a programmable logic device that operates with clocks of 400 MHz to 500 MHz, the clock used during at-speed testing may be (as an example) 500 MHz. Because read and write operations are performed on the memory under test at normal clock speeds, errors can be detected that might be missed during low-speed testing. Because the shadow memory is used, address and bit position information can be gathered for each test word. Using the address and bit position information, test results can be presented in the form of a bit map of the memory under test. Use of the bit map helps a designer perform a satisfactory failure analysis on the memory block for debugging and yield enhancement.

When the built in self test circuitry 66 has finished applying address and data signals to the memory 88, the built in self test circuitry can generate a built-in-self-test (BIST) done signal for the tester 24 (step 156).

At step 158, the tester 24 directs the built in self test circuitry to upload the test results from the shadow memory 112. The test results are uploaded using the path 114 on the programmable logic device 10 and the path 26 between the device 10 and the tester 24 (FIG. 1).

If desired, test results may be transferred from the tester 24 to diagnostic tool 30 over path 28 (step 160). In general, tester 24 and diagnostic tool 30 may be implemented using personal computers, workstations, networks of personal computers and workstations, or any other suitable stand-alone or networked computing equipment.

At step 162, the tester and/or the diagnostic tool can analyze the test results. For example, if the test results include only a raw bit pattern and not the results of on-chip comparison operations performed using comparator circuitry 90, the diagnostic tool 30 may use information on the test data patterns that were generated by the built in self test circuitry 66 to determine which of the uploaded bits from the shadow memory represent memory faults. As another example, the diagnostic tool 30 can use information on the logic circuits of device 10 and information on the physical layout of these logic circuits to identify possible circuit locations and/or physical location on the device 10 corresponding to faults.

The foregoing is merely illustrative of the principles of this invention and various modifications can be made by those skilled in the art without departing from the scope and spirit of the invention.

What is claimed is:

1. A method of testing memory on a programmable logic device that contains a first memory block and a second memory block and that operates at a clock speed allowed during normal operation of the memory in a system, the method comprising:
configuring the programmable logic device to implement built in self test circuitry and signal paths between the built in self test circuitry, the first memory block, and the second memory block;
performing at-speed tests on the first memory block with the built in self test circuitry to produce test results; and
producing a test results bit map for the first memory block by writing the test results into the second memory block.

2. The method defined in claim 1 wherein there is a highest clock speed allowed when operating the memory normally in the system and wherein performing the at-speed tests comprises writing test data patterns into the first memory block at the highest clock speed.

3. The method defined in claim 1 wherein there is a highest clock speed allowed when operating the memory normally in the system, wherein the built in self test circuitry includes an address generator and a test data pattern generator, and wherein performing the at-speed tests comprises:
generating test data patterns for the first memory block with the test data pattern generator;
generating corresponding addresses with the address generator; and
writing the generated test data patterns into the first memory block at the corresponding addresses at the highest clock speed.

4. The method defined in claim 1 wherein performing the at-speed tests comprises:
reading data words from first memory block while generating expected data words with the built in self test circuitry; and
comparing the data words read from the first memory block with the expected data words using comparator circuitry to generate the test results.

5. The method defined in claim 1 wherein there is a highest clock speed allowed when operating the memory normally in the system, wherein the built in self test circuitry includes an address generator and a test data pattern generator, and wherein performing the at-speed tests and producing the test results bit map comprises:
generating test data patterns for the first memory block with the test data pattern generator;
generating corresponding addresses with the address generator;
writing the generated test data patterns into the first memory block at the corresponding addresses at the highest clock speed;
reading data words from first memory block while generating expected data words with the built in self test circuitry;
comparing the data words read from the first memory block with the expected data words using comparator circuitry to generate the test results; and
writing the test results generated by the comparator circuitry into the second memory block.

6. The method defined in claim 1, wherein there is a highest clock speed allowed when operating the memory normally in the system, wherein the first memory block and the second memory block have an equal number of memory cells, wherein the built in self test circuitry includes an address generator and a test data pattern generator, and wherein performing the at-speed tests and producing the test results bit map comprises:
generating test data patterns for the first memory block with the test data pattern generator;
generating corresponding addresses with the address generator that address all of the memory cells in the first memory block;
writing the generated test data patterns into the first memory block at the corresponding addresses at the highest clock speed;
using each address to read an associated data word from the first memory block while generating an expected data word for that address with the built in self test circuitry;
comparing the data words read from the first memory block with the expected data words using comparator circuitry to generate the test results;
providing each address used to read a data word from the first memory block to the second memory block over one of the paths; and
at each address used to read a data word, writing the test results generated by the comparator circuitry into the second memory block.

7. A method of testing memory on a programmable logic device that contains a first memory block and a second memory block and that operates at a clock speed allowed during normal operation of the memory in a system, wherein there is a highest clock speed allowed when operating the memory normally in the system, the method comprising:

during writing operations in which data is written to the first memory block,
  using test pattern generation circuitry to generate test data words,
  using address generator circuitry to generate addresses corresponding to each of the test data words, and
  writing the test data words into the first memory block at the corresponding addresses at the highest clock speed;
during read operations in which data is read from the first memory block,
  using the test pattern generation circuitry to generate expected test data words,
  using the address generator circuitry to generate addresses corresponding to each of the expected test data words, and
  reading the test data words that were written into the first memory block from the first memory block at each of the addresses corresponding to the expected test data words; and
during comparison and writing operations in which data is written into the second memory block,
  comparing the test data words read from the first memory block to the expected test data words to produce corresponding comparison data words, and
  writing each of the comparison data words into the second memory block at the addresses that correspond to each of the expected test data words to produce a bit map of errors in the first memory block.

8. The method defined in claim 7 wherein the first memory block and the second memory block contain an equal number of memory cells, the method further comprising:
  uploading the comparison data words from the second memory block to a tester.

9. The method defined in claim 7 further comprising using a tester to load configuration data into the programmable logic device that programs programmable logic on the programmable logic device to form the address generator circuitry.

10. The method defined in claim 7 further comprising using a tester to load configuration data into the programmable logic device that programs programmable logic on the programmable logic device to form the test pattern generation circuitry.

11. The method defined in claim 7, wherein the programmable logic device has a first memory decoder that decodes addresses for the first memory block and a second address decoder that decodes addresses for the second memory block, the method further comprising using the address generator to simultaneously apply the same address to both the first memory decoder and the second memory decoder to read the test data words from the first memory block and to write the comparison data words into the second memory block.

12. The method defined in claim 7, wherein the programmable logic device has a first memory decoder that decodes addresses for the first memory block and a second address decoder that decodes addresses for the second memory block, the method further comprising:
  using a tester to load configuration data into the programmable logic device that programs programmable interconnects on the programmable logic device to form address paths between the address generator and the first memory decoder and between the address generator and the second memory decoder; and
  using the address generator and the address paths to simultaneously apply the same address to both the first memory decoder and the second memory decoder to read the test data words from the first memory block and to write the comparison data words into the second memory block.

13. A programmable logic device integrated circuit that operates at a clock speed allowed during normal operation of the programmable logic device integrated circuit in a system, wherein there is a highest clock speed allowed when operating the programmable logic device normally in the system, comprising:
  a memory block that is tested at the highest clock speed to produce a test results bit map;
  a shadow memory of identical size to the memory block that stores the test results bit map;
  a test data pattern generator that provides test data words at the highest clock speed to the memory block; and
  an address generator that, during writing operations for the memory block, applies addresses corresponding to the test data words to the memory block at the highest clock speed to write the test data words into the memory block and that, during reading operations for the memory block, simultaneously applies identical addresses to the memory block and to the shadow memory, wherein while each of the identical addresses is being applied, data is read from the first memory block at that address and corresponding data is stored in the shadow memory using that identical address.

14. The programmable logic device defined in claim 13 wherein the shadow memory comprises a single memory block and wherein the memory block and the single shadow memory block contain an equal number of memory cells.

15. The programmable logic device defined in claim 13 wherein the shadow memory comprises a first shadow memory block and a second shadow memory block and wherein the memory block and the shadow memory contain an equal number of memory cells.

16. The programmable logic device defined in claim 13 wherein the shadow memory comprises at least two memory blocks, the programmable logic device further comprising mapping logic that receives addresses from the address generator and that provides corresponding mapped addresses that address the at least two memory blocks.

17. The programmable logic device defined in claim 13 further comprising:
  a first address path between the address generator and the memory block; and
  a second address path between the address generator and the shadow memory, wherein each of the identical addresses is applied by simultaneously routing each of the identical addresses to both the memory block and the shadow memory using the first and second address paths.

18. The programmable logic device defined in claim 13 further comprising:
  first programmable interconnects that have been programmed to form an address path between the address generator and the memory block; and
  second programmable interconnects that have been programmed to form an address path between the address generator and the shadow memory, wherein each of the identical addresses is applied by simultaneously routing each of the identical addresses to both the memory block and the shadow memory using the address paths.

19. The programmable logic device defined in claim 13 further comprising:
- programmable logic that has been programmed to form the address generator and the test data pattern generator;
- first programmable interconnects that have been programmed to form an address path between the address generator and the memory block; and
- second programmable interconnects that have been programmed to form an address path between the address generator and the shadow memory, wherein each of the identical addresses is applied by simultaneously routing each of the identical addresses to both the memory block and the shadow memory using the address paths.

20. The programmable logic device defined in claim 13, wherein the shadow memory comprises a data input and a data output, the programmable logic device further comprising:
- first programmable interconnects that have been programmed to form an address path between the address generator and the memory block;
- second programmable interconnects that have been programmed to form an address path between the address generator and the shadow memory, wherein each of the identical addresses is applied by simultaneously routing each of the identical addresses to both the memory block and the shadow memory using the address paths;
- programmable logic that has been programmed using configuration data to form the address generator and the test data pattern generator; and
- logic and feedback paths connected between the data output of the shadow memory and the data input that allow the shadow memory to retain a record of past results so that multiple tests can be performed before test results are uploaded to a tester.

* * * * *